(12) United States Patent
Wang et al.

(10) Patent No.: US 11,281,105 B2
(45) Date of Patent: Mar. 22, 2022

(54) LIGHT GENERATION METHOD AND SYSTEM

(71) Applicant: Shanghai Bixiufu Enterprise Management Co., Ltd., Shanghai (CN)

(72) Inventors: Lijiang Wang, Shanghai (CN); Wei Wang, Shanghai (CN); Song Zhu, San Francisco, CA (US)

(73) Assignee: Shanghai Bixiufu Enterprise Management Co., Ltd., Shanghai (CN)

( * ) Notice: Subject to any disclaimer, the term of this patent is extended or adjusted under 35 U.S.C. 154(b) by 0 days.

(21) Appl. No.: 16/757,378

(22) PCT Filed: Oct. 23, 2018

(86) PCT No.: PCT/CN2018/111323
§ 371 (c)(1),
(2) Date: Apr. 18, 2020

(87) PCT Pub. No.: WO2019/080819
PCT Pub. Date: May 2, 2019

(65) Prior Publication Data
US 2020/0249574 A1     Aug. 6, 2020

(30) Foreign Application Priority Data

Oct. 23, 2017 (CN) .......................... 201710995561.3

(51) Int. Cl.
*G03F 7/20* (2006.01)
*G02B 27/10* (2006.01)

(52) U.S. Cl.
CPC .......... *G03F 7/2002* (2013.01); *G02B 27/10* (2013.01); *G03F 7/7005* (2013.01); *G03F 7/7055* (2013.01)

(58) Field of Classification Search
CPC .... G03F 7/7005; G03F 7/7055; G03F 7/2002; G02B 27/10
(Continued)

(56) References Cited

U.S. PATENT DOCUMENTS 5,463,468 A * 10/1995 Takanashi .............. G09G 3/002
358/296
6,496,272 B1 * 12/2002 Watanabe .......... G01N 21/8806
356/614
(Continued)

FOREIGN PATENT DOCUMENTS

| CN | 106 292187 A | 1/2017 |
| EP | 2190017 A1 | 5/2010 |
| TW | 200742868 A | 11/2007 |

OTHER PUBLICATIONS

International Search Report, issued in PCT/CN2018/111323, dated Jan. 15, 2019.
(Continued)

*Primary Examiner* — Hung Nguyen
(74) *Attorney, Agent, or Firm* — Zhu Lehnhoff LLP

(57) ABSTRACT

The invention provides a light generating method and system, the method including: generating first light, the first light being capable of forming a first area, a second area, and a third area, and intensity of the first light in the first area being higher than that in the second area and the third area, respectively; generating second light, the second light being capable of simultaneously irradiating the first area and the second area; generating third light, the third light being capable of simultaneously irradiating the first area and the third area; and controlling intensity of the second light and the third light, respectively. The light generating method and system provided by the invention can not only generate light having a super-resolution that may approach infinitesimal in theory but also employ light output by a laser as the only (Continued)

original light source, featuring extremely low costs and freedom from the diffraction limit of the light source, showing a great prospect of applications in the field of lithography.

20 Claims, 10 Drawing Sheets

(58) Field of Classification Search
USPC .................................................. 355/67–71
See application file for complete search history.

(56) References Cited

U.S. PATENT DOCUMENTS

| | | |
|---|---|---|
| 8,994,920 B1 | 3/2015 | Johnson |
| 2005/0111089 A1 | 5/2005 | Baer |
| 2013/0130182 A1 | 5/2013 | Markle |
| 2018/0066810 A1* | 3/2018 | Lentine .............. G02B 19/0061 |

OTHER PUBLICATIONS

Written Opinion, issued in PCT/CN2018/111323, dated Jan. 15, 2019.
Communication and Supplementary European Search Report issued in EP18871502 (Epo counterpart application), issued on 2021-07-02.

* cited by examiner

LIGHT GENERATION METHOD AND SYSTEM

TECHNICAL FIELD

The invention relates to the technical field of optics, and relates to light for lithography, in particular to a light generating method and system.

BACKGROUND ART

Lithography is an important technology link in current industrial precision machining. In particular, lithography has wide applications in the field of micro-nano machining, such as integrated circuit chips, MEMS devices, optical integration technology, and precision optics. At present, the mainstream high-precision lithography manufacturing processes mainly include optical projection micro-lithography, electron light beam direct writing, ion light beam machining, laser interference lithography and the like. According to the Rayleigh resolution equation: $R=k1\lambda/NA$, it is known that an increase in resolution can be achieved by increasing the numerical aperture NA of a lithography objective lens and shortening the exposure wavelength $\lambda$. At present, immersion lithography is adopted as a method for increasing the numerical aperture for a lithography machine, an ArF light source with a wavelength of 193 nm is adopted as the most popular and mature means of exposure to short-wavelength light, and the minimum resolution cannot break through 45 nm even if the method of improving NA by immersion lithography is adopted.

The existing exposure-based lithography technology features an improvement of the resolution based on the Rayleigh equation by adopting the conventional optical principles, mainly by adopting the immersion method to improve the numerical aperture and adopting a shorter-wavelength light source, especially the latter which plays a decisive role in improving the resolution. However, it is complex and difficult to manufacture an excimer light source, the electron light beam and even the extreme ultraviolet light source which are extremely costly, therefore a direct super-resolution exposure lithographic machine is very expensive, and the resolution is still limited by the diffraction limit of the light source.

SUMMARY OF THE INVENTION

Given the above-mentioned disadvantages of the prior art, it is an object of the present invention to provide a light generating method and system for solving the problem that the Rayleigh resolution of the existing light source is limited by the diffraction limit of the light source and it is thus difficult to make a breakthrough.

To achieve the above object and other related objects, the present invention provides a light generating method, comprising: generating first light, the first light being capable of forming a first area, a second area, and a third area, and intensity of the first light in the first area being higher than that in the second area and the third area, respectively; generating second light, the second light being capable of simultaneously irradiating the first area and the second area; generating third light, the third light being capable of simultaneously irradiating the first area and the third area; and controlling intensity of the second light and the third light, respectively.

In an embodiment of the present invention, the first light forms a discrete first area through a first-type light conversion assembly.

In an embodiment of the present invention, the first light forms a continuous first area through a second-type light conversion assembly.

In an embodiment of the invention, the first light forms a mixed first area through a third-type light conversion assembly; the mixed first area includes the discrete first area and the continuous first area.

In an embodiment of the invention, the second area and the third area are sized on a nanometer scale.

In an embodiment of the invention, an area irradiated by the second light in the second area is a first super-resolution area; the first super-resolution area has an inner diameter ranging from 0 to 100 nm.

In an embodiment of the invention, the first super-resolution area has an inner diameter ranging from 0 to 10 nm.

In an embodiment of the invention, an area irradiated by the third light in the third area is a second super-resolution area; the second super-resolution area has an inner diameter ranging from 0 to 100 nm.

In an embodiment of the invention, the second super-resolution area has an inner diameter ranging from 0 to 10 nm.

In an embodiment of the invention, the method further comprises: controlling intensity of the second light or/and the third light by controlling ON and OFF of the second light or/and the third light; or/and controlling the intensity of the second light by controlling light radiation power of a light source of the second light; or/and controlling the intensity of the third light by controlling the light radiation power of the light source of the third light; or/and controlling the intensity of the first light by controlling the light radiation power of the light source of the first light.

In an embodiment of the invention, the second light and the third light are from the same light source; or the second light and the third light are from different light sources.

The present invention also provides a light generating system, comprising: first light source generating first light, the first light being capable of forming a first area, a second area, and a third area, and intensity of the first light in the first area being higher than that in the second area and the third area, respectively; second light source generating second light, the second light being capable of simultaneously irradiating the first area and the second area; third light source generating third light, the third light being capable of simultaneously irradiating the first area and the third area; and a light control device controlling intensity of the second light and the third light, respectively.

In an embodiment of the invention, the light generating system further comprises: a first-type light conversion assembly through which the first light forms a discrete first area; the first-type light conversion assembly includes a first lens group, a beam shaping device, a microlens array group, or/and a dual-beam phase conversion array group.

In an embodiment of the invention, the light generating system further comprises: a second-type light conversion assembly through which the first light forms a continuous first area; the second-type light conversion assembly comprises a second lens group, a polarizing device, a third lens group, a Gaussian-beam shaping device, an annular-beam shaping device, a spectroscope, or/and a phase-type diffraction grating array.

In an embodiment of the invention, the light generating system further comprises: a third-type light conversion assembly through which the first light forms a mixed first area; the mixed first area comprises the discrete first area and the continuous first area; the third-type light conversion assembly comprises a fourth lens group, a polarizing device, a fifth lens group, a Gaussian-beam shaping device, an annular-beam shaping device, a spectroscope, or/and a phase-type diffraction grating array.

In an embodiment of the invention, the second area and the third area are sized on a nanometer scale.

In an embodiment of the invention, the light generating system further comprises: first light path assembly through which the second light simultaneously irradiates the first area and the second area; the first light path assembly comprises any of or a combination of more of a lens group, a shaping device, a polarizing device, a grating and a spectroscope.

In an embodiment of the invention, the third light source comprises the second light source and second light path assembly; the second light path assembly takes a separated part of the second light output by the second light source as the third light; the second light path assembly comprises any of or a combination of more of a lens group, a shaping device, a polarizing device, a grating and a spectroscope.

In an embodiment of the invention, the light generating system further comprises: third light path assembly through which the third light simultaneously irradiates the first area and the third area; the third light path assembly comprises any of or a combination of more of a lens group, a shaping device, a polarizing device, a grating and a spectroscope.

In an embodiment of the invention, the first light source comprises: a first Gaussian light source generating a first Gaussian light.

In an embodiment of the invention, the first light source further comprises: a first flat-top unit that shapes the first Gaussian light into a first flat-top light; or a first flat-top light source generating the first flat-top light.

In an embodiment of the invention, the first light source further comprises: a first array unit that shapes the first Gaussian light or the first flat-top light into a first arrayed light; or a first arrayed light source generating the first arrayed light.

In an embodiment of the invention, the second light source comprises: a second Gaussian light source generating a second Gaussian light.

In an embodiment of the invention, the second light source further comprises: a second flat-top unit that shapes the second Gaussian light into a second flat-top light; or a second flat-top light source generating the second flat-top light.

In an embodiment of the invention, the second light source further comprises: a second array unit that shapes the second Gaussian light or the second flat-top light into a second arrayed light; or a second arrayed light source generating the second arrayed light.

In an embodiment of the invention, the third light source comprises: a third Gaussian light source generating a third Gaussian light.

In an embodiment of the invention, the third light source further comprises: a third flat-top unit that shapes the third Gaussian light into a third flat-top light; or a third flat-top light source generating the third flat-top light.

In an embodiment of the invention, the third light source further comprises: a third array unit that shapes the third Gaussian light or the third flat-top light into a third arrayed light; or a third arrayed light source generating the third arrayed light.

In an embodiment of the present invention, the light control device comprises: a spatial light modulator for controlling ON and OFF of the second light or/and the third light to control intensity of the second light or/and the third light; or/and a light power controller for controlling light radiation power of the second light source to control the intensity of the second light; or/and controlling the light radiation power of the third light source to control the intensity of the third light; or/and controlling the light radiation power of the first light source to control the intensity of the first light.

As described above, the light generation method and system of the present invention have the following advantages:

The light generating method and system can not only generate light having a super-resolution that may approach infinitesimal in theory but also employ light output by a laser as the only original light source, featuring extremely low costs and freedom from the diffraction limit of the light source, showing a great prospect of applications in the field of lithography.

BRIEF DESCRIPTION OF THE DRAWINGS

FIG. 2A-1 shows a schematic diagram of an implementation of a first area according to an embodiment of the present invention.

FIG. 2A-2 shows a schematic diagram of an implementing configuration of a first-type light conversion assembly according to an embodiment of the present invention.

FIG. 2B-1 shows a schematic diagram of another implementation of the first area according to an embodiment of the present invention.

FIG. 2B-2 shows a schematic diagram of an implementing configuration of a second-type light conversion assembly according to an embodiment of the present invention.

FIG. 2C-1 shows a schematic diagram of a third implementation of the first area according to an embodiment of the invention.

FIG. 2C-2 shows a schematic diagram of an implementing configuration of a third-type light conversion assembly according to an embodiment of the present invention.

DESCRIPTION OF ELEMENT NUMBERS

Figure 1:
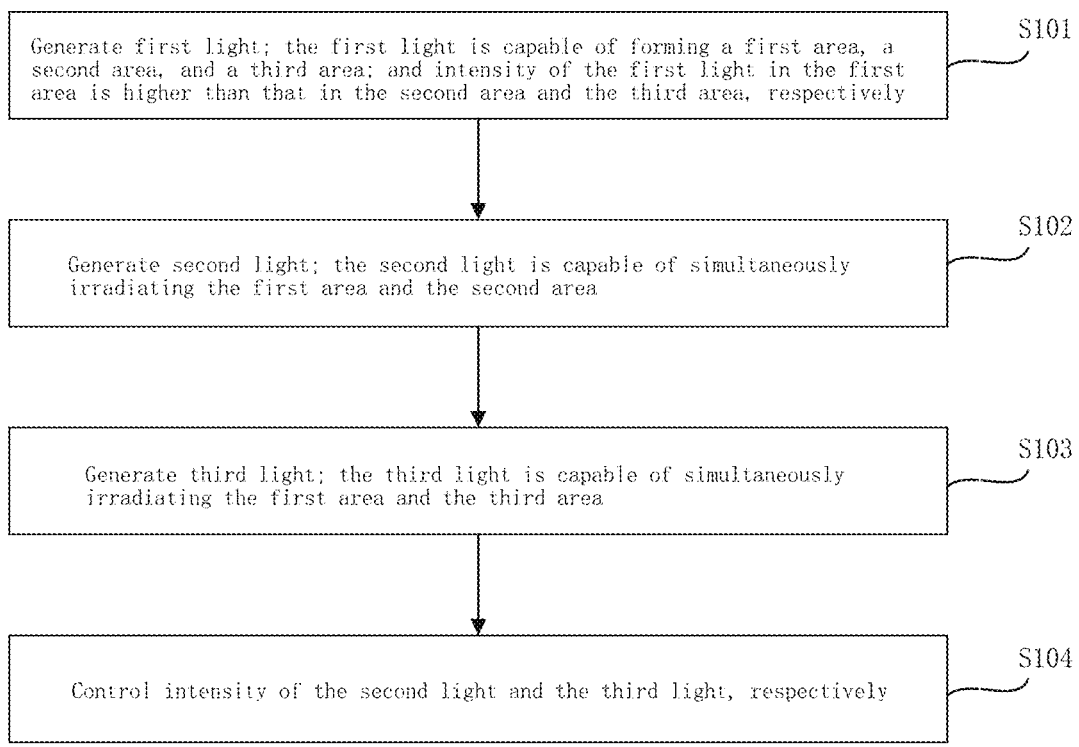
FIG. 1 shows a schematic diagram of an implementing flow of a light generating method according to an embodiment of the present invention.

S101-S104 Steps
201. First lens group
202 Beam shaping device
203 Beam expanding device
204 Microlens array group
205 Dual-beam phase conversion array group
206 Spatial light modulator
207 Lens group
208 Lens group
209 Lithographic material
2010 Precision displacement platform
211 Second lens group 212 Polarizing device
213 Third lens group
214 Gaussian-beam shaping device
215 Annular-beam shaping device
216 Spectroscope
217 Phase-type diffraction grating array
218 Spatial light modulator
219 Lens group
2110 Lens group
2111 Lithographic material
2112 Precision displacement platform
221 Fourth lens group
222 Polarizing device
223 Fifth lens group
224 Gaussian-beam shaping device
225 Annular-beam shaping device
226 Spectroscope
227 Phase-type diffraction grating array
228 Spatial light modulator
229 Lens group
2210 Lens group
2211 Lithographic material
2212 Precision displacement platform
300 Light generating system
301 First light source
3011 First Gaussian light source
3012 First flat-top unit
3013 First flat-top light source
3014 First array unit
3015 First arrayed light source
302 Second light source
3021 Second Gaussian light source
3022 Second flat-top unit
3023 Second flat-top light source
3024 Second array unit
3025 Second arrayed light source
303 Third light source
3031 Third Gaussian light source
3032 Third flat-top unit
3033 Third flat-top light source
3034 Third array unit
3035 Third arrayed light source
304 Light control device
3041 Spatial light modulator
3042 Light power controller
305 First-type light conversion assembly
306 Second-type light conversion assembly
307 Third-type light conversion assembly
308 First light path assembly
309 Second light path assembly
310 Third light path assembly

DETAILED DESCRIPTION OF THE INVENTION

Other advantages and efficiencies of the present invention will become readily apparent to those skilled in the art from the disclosure of this description, as the embodiments of the invention are illustrated by the following specific examples. The present invention can also be implemented or applied through different specific implementations, and various details in this specification can also be modified or changed based on different viewpoints and applications without departing from the spirit of the present invention. It is noted that the following embodiments and features of the embodiments may be combined if without conflict.

It is noted that the drawings provided in the following examples illustrate, by way of illustration only, the basic concepts of the present invention, and that only the components that are pertinent to the present invention are shown in the drawings and are not drawn to scale, shape and number of components in actual implementation; the type, number, and proportions of components in an actual implementation may vary as desired, and the layout of components may be more complex.

The existing exposure-based lithography technology features an improvement of the resolution based on the Rayleigh equation by adopting the conventional optical principles, mainly by adopting the immersion method to improve the numerical aperture and adopting a shorter-wavelength light source, especially the latter which plays a decisive role in improving the resolution. However, it is complex and difficult to manufacture an excimer light source, the electron light beam and even the extreme ultraviolet light source which are extremely costly, therefore a direct super-resolution exposure lithographic machine is very expensive, and the resolution is still limited by the diffraction limit of the light source.

The light generating method and system can not only generate light having a super-resolution that may approach infinitesimal in theory but also employ light output by a laser as the only original light source, featuring extremely low costs and freedom from the diffraction limit of the light source, showing a great prospect of applications in the field of lithography.

With reference to FIG. 1, the present invention provides a light generating method, including:

S101, generating first light, the first light being capable of forming a first area, a second area, and a third area, and intensity of the first light in the first area being higher than that in the second area and the third area, respectively;

S102, generating second light, the second light being capable of simultaneously irradiating the first area and the second area;

S103, generating third light, the third light being capable of simultaneously irradiating the first area and the third area; and S104, controlling intensity of the second light and the third light, respectively.

Figures 1, 2A:
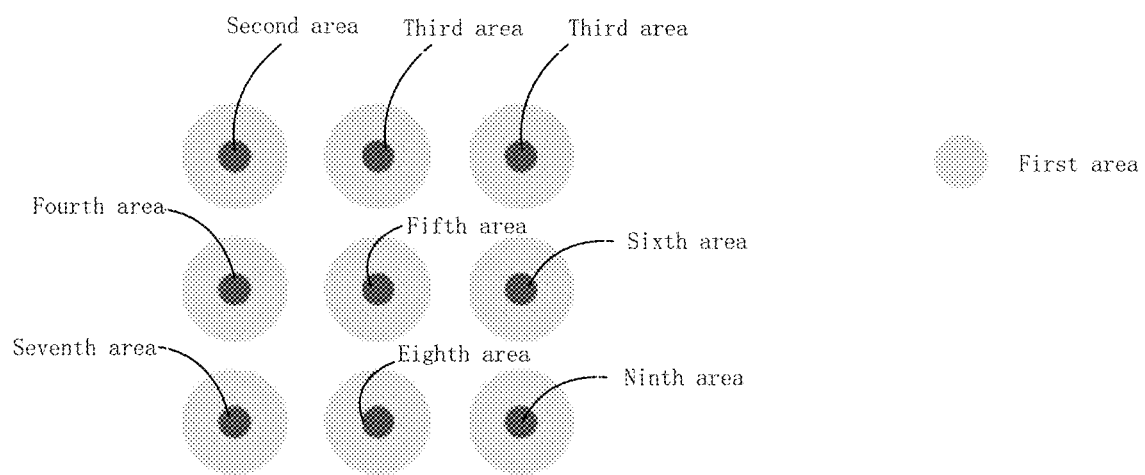

In an embodiment of the present invention, the first light forms a discrete first area through a first-type light conversion assembly. The first area is an area where the first light irradiates to form a bright area, and the discrete first area is an area formed by two or more discontinuous bright areas. With reference to FIG. 2A-1, the first light is converted into an annular arrayed light through the first-type light conversion assembly, and the annular arrayed light can form the discrete first area (bright area) and a plurality of dark areas such as a second area (dark area 1), a third area (dark area 2), a fourth area (dark area 3), and a fifth area (dark area 4).

Figures 2, 2A:
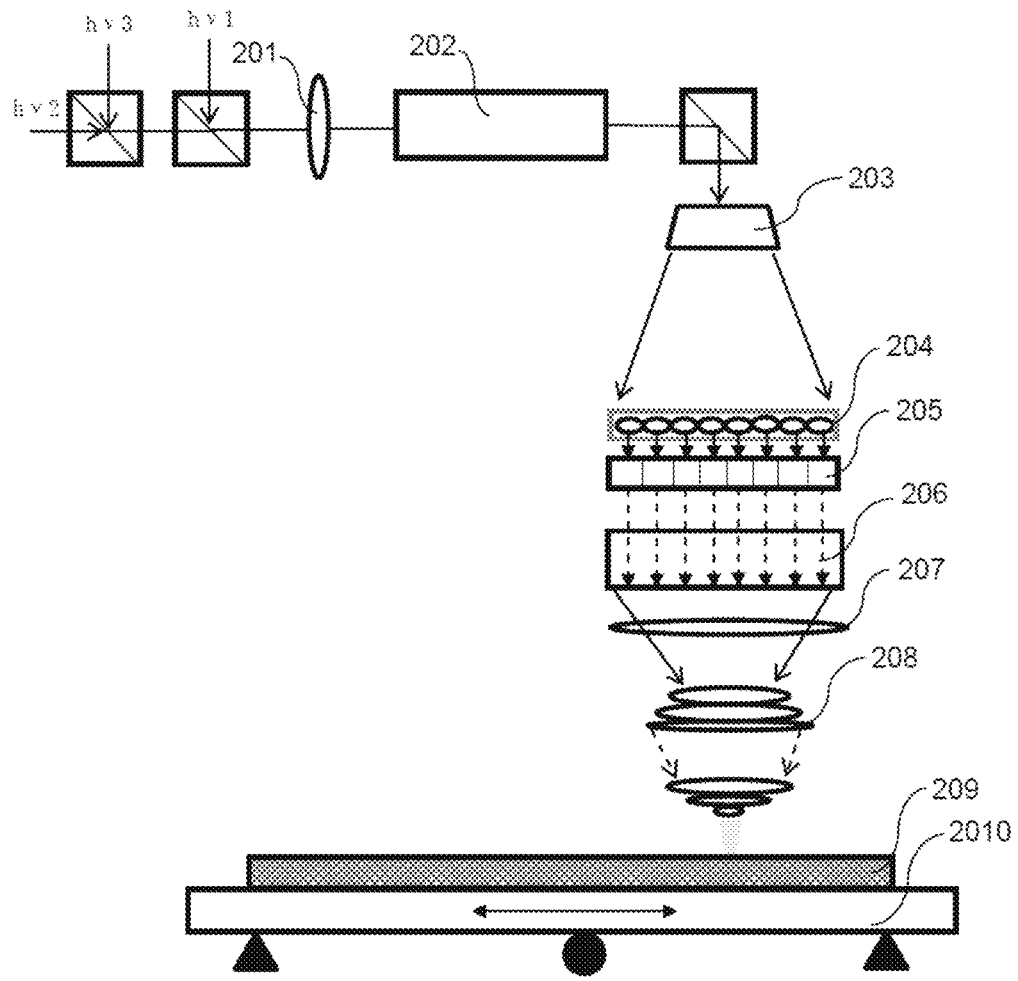

With reference to FIG. 2A-2, the first-type light conversion assembly includes: a first lens group 201, a beam shaping device 202, a beam expanding device 203, a micro-lens array group 204 and a double-beam phase conversion array group 205; and the first light includes an annular light initial input beam hv1 and a solid Gaussian light initial input beam hv2. Beams hv1 and hv2 are combined by the spectroscope, gathered through the first lens group 201, and then enter the beam shaping device 202 to realize the concentricity of beams hv1 and hv2 to form a concentric light beam; the beam expanding device 203 may typically be implemented using a polarization maintaining fiber. The beam expanding device 203 converts the solid Gaussian beam in the concentric beam into a flat-top beam with an even energy distribution, and the flat-top concentric beam is converted into an array-type concentric beam through the microlens array group 204. The dual-beam phase conversion array group 205 corresponds to the microlens array group 204, and each concentric beam output from the microlens array group 204 enters a corresponding phase conversion unit to realize a conversion of hv1 from an initial beam to an annular-beam, while hv2 still keeps as a solid beam, thereby realizing array-type dual beams, that is, an annular arrayed light. The annular light initial input beam is also a Gaussian beam. The arrayed double beams enter a spatial light modulator 206 corresponding to a pixel unit, and the spatial light modulator 206 can control ON and OFF of the double beams of each pixel at a high speed employing a computer program, so that each of the double beams can be modulated and the writing of patterns can be controlled. The dual-beam array coming out of the spatial light modulator 206 is focused through a lens group 207, then the image is miniaturized through an image-miniaturizing lens group 208, and finally, high-speed parallel dual-beam lithography is realized on the surface of a lithographic material 209. The lithographic material is subjected to displacement stepping control under the control of a precision displacement platform 2010.

Figures 1, 2B:
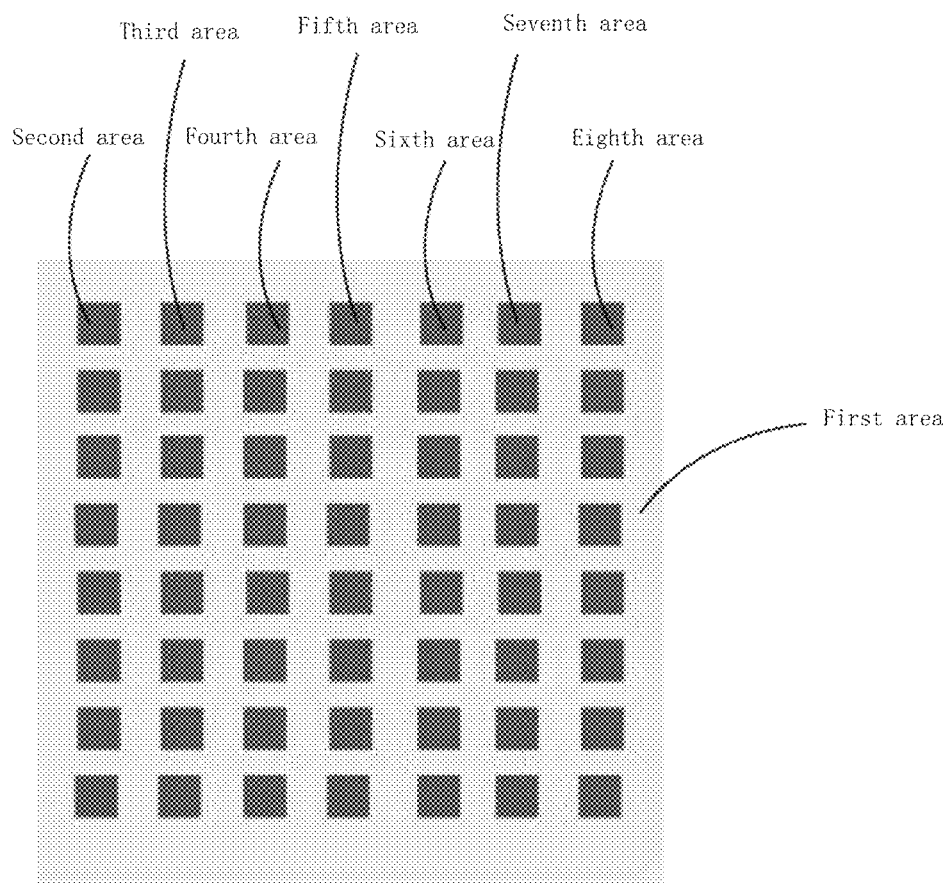
Figures 2, 2B:
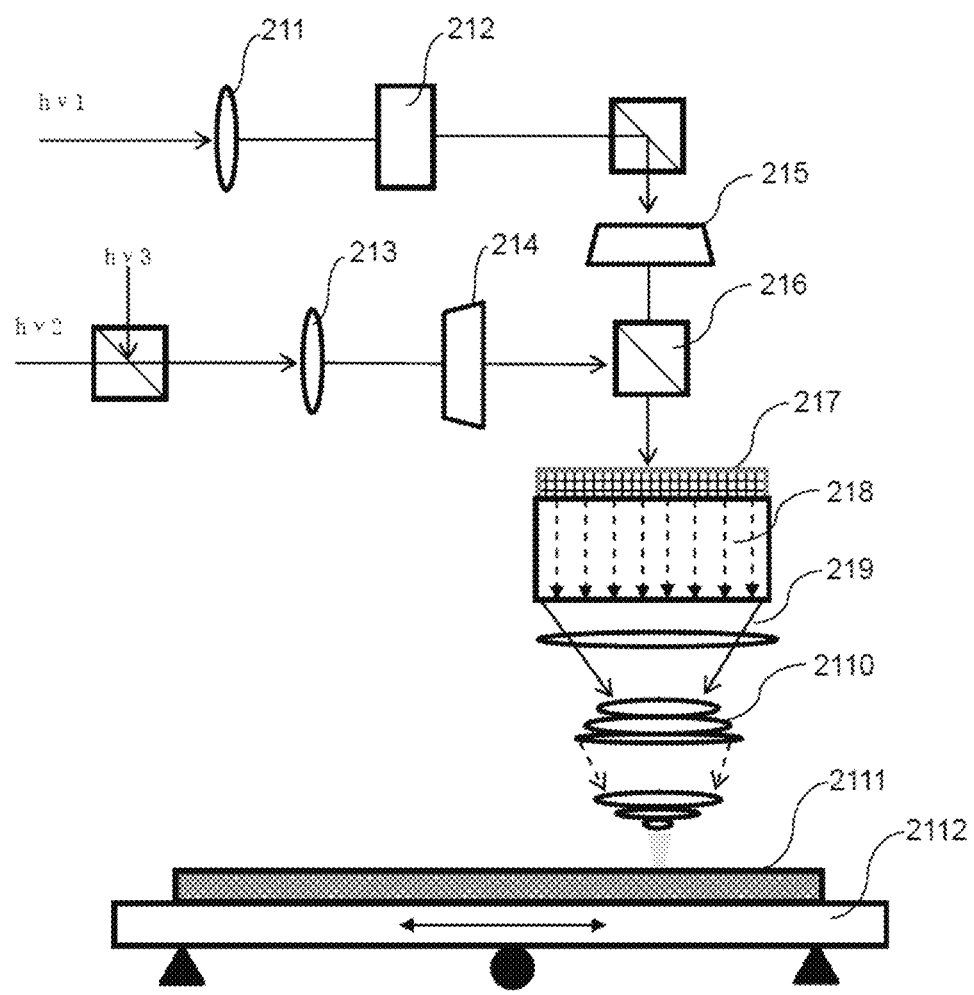

In an embodiment of the present invention, the first light forms a continuous first area through a second-type light conversion assembly. The first area is an area where the first light irradiates to form a bright area, and the continuous first area is an area where the continuous bright area is formed. With reference to FIG. 2B-1, the first light is converted into grating light by the second-type light conversion assembly, and the grating light can form the continuous first area (bright area) and a plurality of dark areas such as the second area (dark area 1), the third area (dark area 2), the fourth area (dark area 3), the fifth area (dark area 4), a sixth area (dark area 5), a seventh area (dark area 6), an eighth area (dark area 7), a ninth area (dark area 8) and a tenth area (dark area 9).

With reference to FIG. 2B-2, the second-type light conversion assembly includes: a second lens group 211, a polarizing device 212, a third lens group 213, a Gaussian-beam shaping device 214, an annular-beam shaping device 215, a spectroscope 216 and a phase-type diffraction grating array 217; and the first light includes the annular light initial input beam hv1 and the solid Gaussian light initial input beam hv2. Beam hv1 first passes through the second lens group 211 and then enters the polarizing device 212 to produce a desired polarized beam. The solid Gaussian beam hv2 passes through the third lens group 213 and is converted into a flat-top beam by the Gaussian beam shaping device 214. The polarized light beam converted from hv1 is also converted into a hollow flat-top beam by the annular-beam shaping device 215. The shaped two beams are combined through the spectroscope 216 and pass through the phase-type diffraction grating array 217, and the polarized hv1 is converted into array-type vortex light to form annular arrayed light. The annular arrayed light enters a spatial light modulator 218 corresponding to the pixel unit, and the spatial light modulator 218 can control ON and OFF of the double beams of each pixel at a high speed employing a computer program, so that each of the double beams can be modulated and the writing of patterns can be controlled. The dual-beam array coming out of the spatial light modulator 218 is focused through a lens group 219, then the image is miniaturized through an image-miniaturizing lens group 2110, and finally, high-speed parallel dual-beam lithography is realized on the surface of a lithographic material 2111. The lithographic material is subjected to displacement stepping control under the control of a precision displacement platform 2112.

Figures 1, 2C:
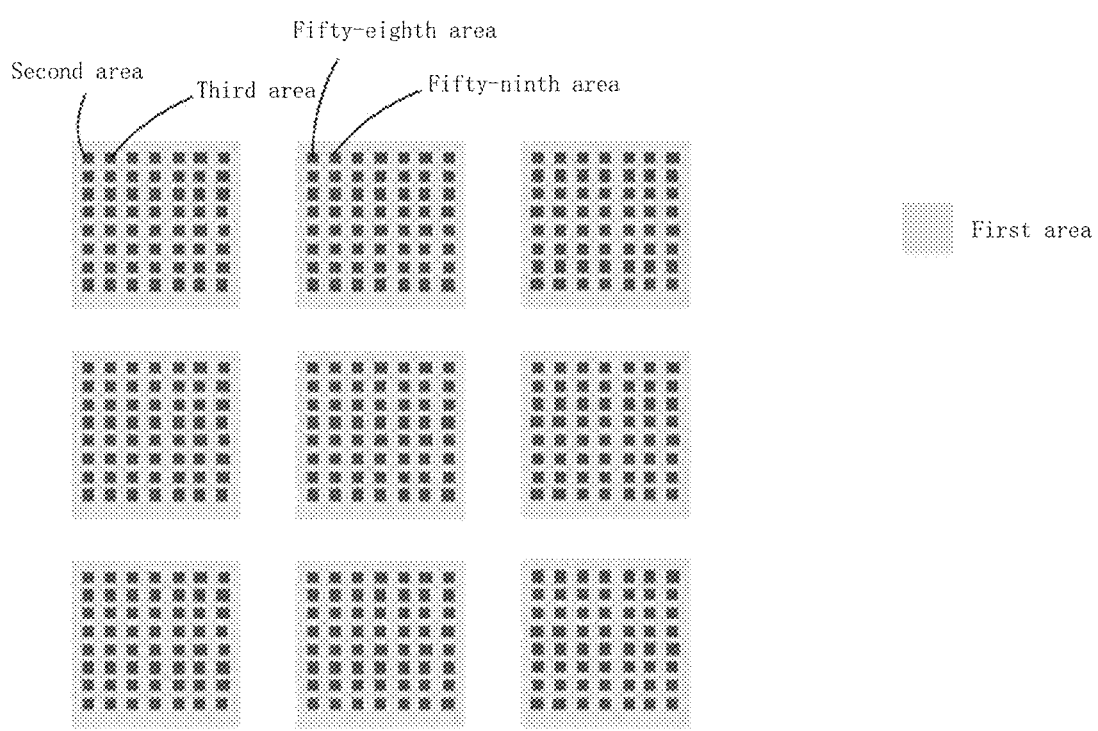
Figures 2, 2C:
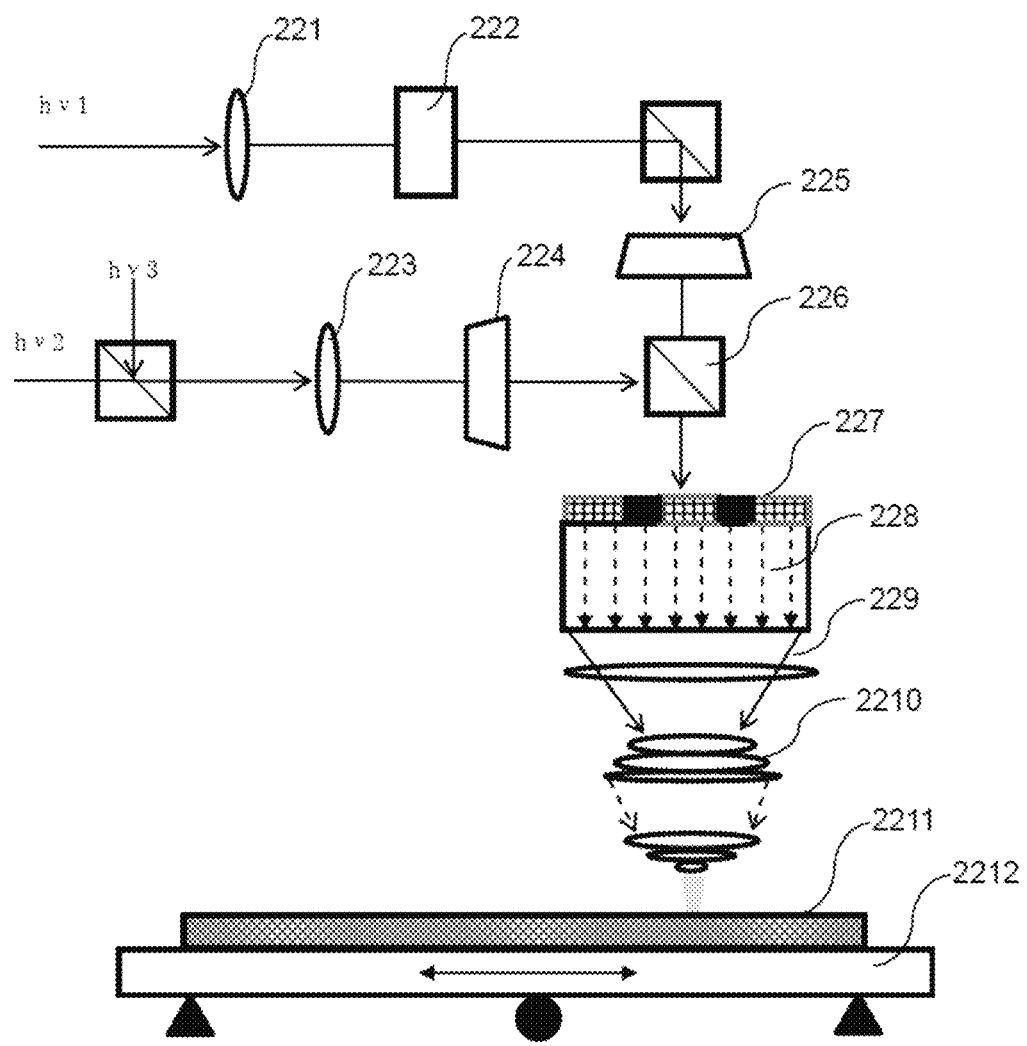

In an embodiment of the invention, the first light is generated by a third-type light conversion assembly and can form a mixed first area; the mixed first area includes the discrete first area and the continuous first area. With reference to FIG. 2C-1, the first light is grating arrayed light that can form the mixed first area (bright area) and a plurality of dark areas such as the second area (dark area 1), the third area (dark area 2), the fourth area (dark area 3), the fifth area (dark area 4), the sixth area (dark area 5), the seventh area (dark area 6), the eighth area (dark area 7), the ninth area (dark area 8) and the tenth area (dark area 9). Wherein the mixed first area is a combination of the discrete first area and the continuous first area arranged in any manner.

With reference to FIG. 2C-2, the third-type light conversion assembly includes: a fourth lens group 221, a polarizing device 222, a fifth lens group 223, a Gaussian-beam shaping device 224, an annular-beam shaping device 225, a spectroscope 226 and a phase-type diffraction grating array 227; and the first light includes the annular light initial input beam hv1 and the solid Gaussian light initial input beam hv2. Beam hv1 first passes through the fourth lens group 221 and then enters the polarizing device 222 to produce a desired polarized beam. The solid Gaussian beam hv2 passes through the fifth lens group 223 and is converted into a flat-top beam by the Gaussian beam shaping device 224. The polarized light beam converted from hv1 is also converted into a hollow flat-top beam by the annular-beam shaping device 225. The shaped two beams are combined through the spectroscope 226 and pass through the phase-type diffraction grating array 227, and the polarized hv1 is converted into array-type vortex light to form annular arrayed light. The annular arrayed light enters a spatial light modulator 228 corresponding to the pixel unit, and the spatial light modulator 228 can control ON and OFF of the double beams of each pixel at a high speed employing a computer program, so that each of the double beams can be modulated and the writing of patterns can be controlled. The dual-beam array coming out of the spatial light modulator 228 is focused through a lens group 229, then the image is miniaturized through an image-miniaturizing lens group 2210, and finally, high-speed parallel dual-beam lithography is realized on the surface of a lithographic material 2211. The lithographic material is subjected to displacement stepping control under the control of a precision displacement platform 2212.

In an embodiment of the invention, the second area or/and the third area is sized on the scale of nanometers.

In an embodiment of the invention, an area irradiated by the second light in the second area is a first super-resolution area; the first super-resolution area has an inner diameter ranging from 0 to 100 nm. In other words, an area where the second area overlaps with the area irradiated by the second light is the first super-resolution area. Since the second area itself is of nano-scale, the smaller the area where the second area overlaps with the area irradiated by the second light is, the smaller the first super-resolution area can be and may approach infinitesimal. Therefore, the inner diameter of the first super-resolution area may preferably range from 0 to 10 nm, even preferably from 0 to 2.4 nm or even smaller.

In an embodiment of the invention, an area irradiated by the third light in the third area is a second super-resolution area; the second super-resolution area has an inner diameter ranging from 0 to 100 nm. In other words, an area where the third area overlaps with the area irradiated by the third light is the second super-resolution area. Since the third area itself is of nano-scale, the smaller the area where the third area overlaps with the area irradiated by the third light is, the smaller the second super-resolution area can be and may approach infinitesimal. Therefore, the inner diameter of the second super-resolution area may preferably range from 0 to 10 nm, even preferably from 0 to 2.4 nm.

In an embodiment of the invention, intensity of the second light or/and the third light can be controlled by controlling ON and OFF of the second light or/and the third light; or/and the intensity of the second light can be controlled by controlling light radiation power of a light source of the second light; or/and the intensity of the third light can be controlled by controlling the light radiation power of the light source of the third light; or/and the intensity of the first light can be controlled by controlling the light radiation power of the light source of the first light.

In an embodiment of the invention, the second light and the third light are from the same light source, and then the intensity of the second light and the intensity of the third light can be controlled by controlling the light radiation power of the light source of the second light or by controlling On and OFF of the second light. Alternatively, the second light and the third light are from different light sources, and then the second light and the third light are controlled by controlling the second light source and the third light source, respectively.

The scope of the light generating method of the present invention is not limited to the specific order of the steps listed in the embodiment described above but is intended to encompass all such alternatives, additions, and subtractions of steps made without departing the spirit of the present invention.

The present invention further provides a light generating system which can implement the light generating method of the present invention; an implementing apparatus of the light generating method of the present invention includes, but is not limited to, the structure of the light generating system exemplified in the embodiment, and all structural variations and substitutions made without departing the spirit of the present invention are included within the scope of the present invention.

Figure 3A:
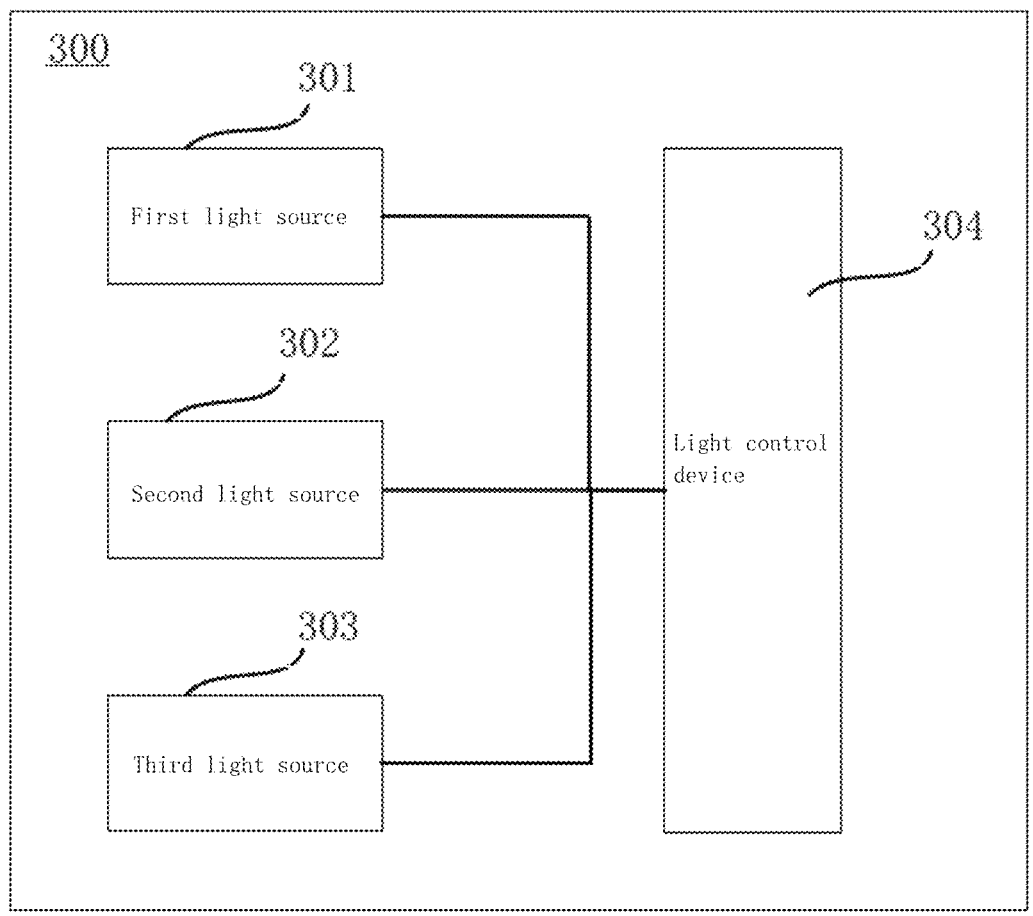
FIG. 3A shows a schematic diagram of an implementing configuration of a light generating system according to an embodiment of the present invention.

With reference to FIG. 3A, the light generating system 300 includes: first light source 301, second light source 302, third light source 303 and a light control device 304.

The first light source 301 generates first light, the first light being capable of forming a first area, a second area, and a third area, and intensity of the first light in the first area being higher than that in the second area and the third area, respectively;
the second light source 302 generates second light, the second light being capable of simultaneously irradiating the first area and the second area;
the third light source 303 generates third light, the third light being capable of simultaneously irradiating the first area and the third area; and
the light control device 304 controls intensity of the second light and the third light, respectively.

Figure 3B:
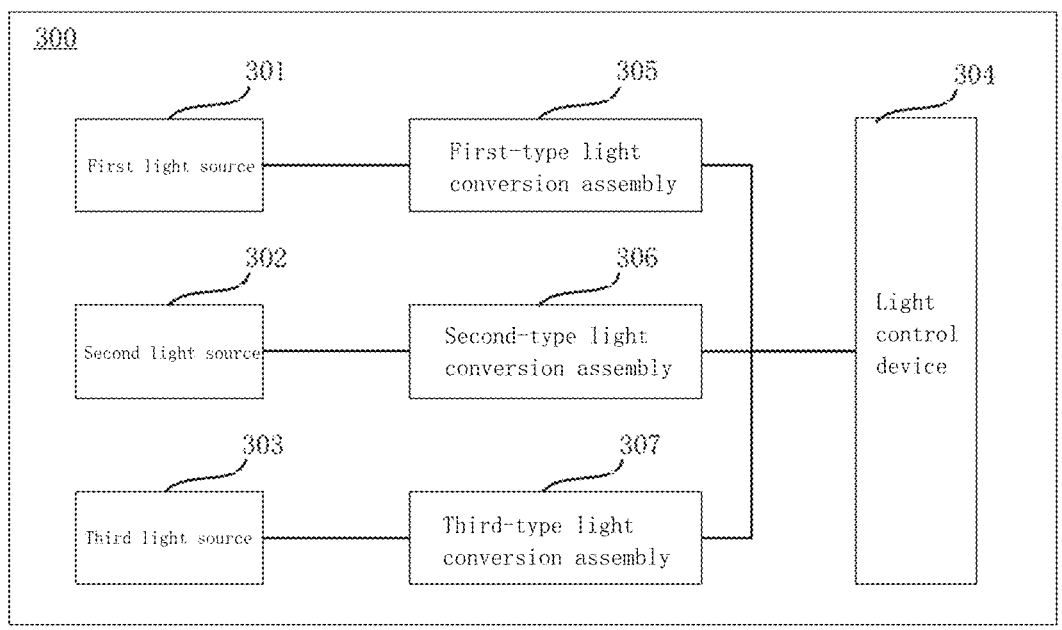
FIG. 3B shows a schematic diagram of another implementing configuration of the light generating system according to an embodiment of the present invention.

In an embodiment of the present invention, as shown in FIG. 3B, the light generating system 300 further includes a first-type light conversion assembly 305; the first light forms a discrete first area through the first-type light conversion assembly 305; the first area is an area where the first light irradiates to form a bright area, and the discrete first area is an area formed by two or more discontinuous bright areas. With reference to FIG. 2A-1, the first light is converted into an annular arrayed light through the first-type light conversion assembly, and the annular arrayed light can form the discrete first area (bright area) and a plurality of dark areas such as a second area (dark area 1), a third area (dark area 2), a fourth area (dark area 3), and a fifth area (dark area 4).

With reference to FIG. 2A-2, the first-type light conversion assembly includes: a first lens group 201, a beam shaping device 202, a beam expanding device 203, a microlens array group 204 and a double-beam phase conversion array group 205; and the first light includes an annular light initial input beam hv1 and a solid Gaussian light initial input beam hv2. Beams hv1 and hv2 are combined by the spectroscope, gathered through the first lens group 201, and then enter the beam shaping device 202 to realize the concentricity of beams hv1 and hv2 to form a concentric light beam; the beam expanding device 203 may typically be implemented using a polarization maintaining fiber. The beam expanding device 203 converts the solid Gaussian beam in the concentric beam into a flat-top beam with an even energy distribution, and the flat-top concentric beam is converted into an array-type concentric beam through the microlens array group 204. The dual-beam phase conversion array group 205 corresponds to the microlens array group 204, and each concentric beam output from the microlens array group 204 enters a corresponding phase conversion unit to realize a conversion of hv1 from an initial beam to an annular-beam, while hv2 still keeps as a solid beam, thereby realizing array-type dual beams, that is, an annular arrayed light. The annular light initial input beam is also a Gaussian beam. The arrayed double beams enter a spatial light modulator 206 corresponding to a pixel unit, and the spatial light modulator 206 can control ON and OFF of the double beams of each pixel at a high speed employing a computer program, so that each of the double beams can be modulated and the writing of patterns can be controlled. The dual-beam array coming out of the spatial light modulator 206 is focused through a lens group 207, then the image is miniaturized through an image-miniaturizing lens group 208, and finally, high-speed parallel dual-beam lithography is realized on the surface of a lithographic material 209. The lithographic material is subjected to displacement stepping control under the control of a precision displacement platform 2010.

In an embodiment of the present invention, as shown in FIG. 3B, the light generating system 300 further includes a second-type light conversion assembly 306; the first light forms a continuous first area through the second-type light conversion assembly 306; the first area is an area where the first light irradiates to form a bright area, and the continuous first area is an area formed by continuous bright areas. With reference to FIG. 2B-1, the first light is converted into grating light by the second-type light conversion assembly, and the grating light can form the continuous first area (bright area) and a plurality of dark areas such as the second area (dark area 1), the third area (dark area 2), the fourth area (dark area 3), the fifth area (dark area 4), a sixth area (dark area 5), a seventh area (dark area 6), an eighth area (dark area 7), a ninth area (dark area 8) and a tenth area (dark area 9).

With reference to FIG. 2B-2, the second-type light conversion assembly includes: a second lens group 211, a polarizing device 212, a third lens group 213, a Gaussian-beam shaping device 214, an annular-beam shaping device 215, a spectroscope 216 and a phase-type diffraction grating array 217, a spatial light modulator 218, a lens group 219, a lens group 2110, a lithographic material 2111 and a precision displacement device 2112; and the first light includes an annular light initial input beam hv1 and a solid Gaussian light initial input beam hv2. Beam hv1 first passes through the second lens group 211 and then enters the polarizing device 212 to produce a desired polarized beam. The solid Gaussian beam hv2 passes through the third lens group 213 and is converted into a flat-top beam by the Gaussian beam shaping device 214. The polarized light beam converted from hv1 is also converted into a hollow flat-top beam by the annular-beam shaping device 215. The shaped two beams are combined through the spectroscope 216 and pass through the phase-type diffraction grating array 217, and the polarized hv1 is converted into array-type vortex light to form annular arrayed light. The annular arrayed light enters the spatial light modulator 218 corresponding to the pixel unit, and the spatial light modulator 218 can control ON and OFF of the double beams of each pixel at a high speed employing a computer program, so that each of the double beams can be modulated and the writing of patterns can be controlled. The dual-beam array coming out of the spatial light modulator 218 is focused through the lens group 219, then the image is miniaturized through the image-miniaturizing lens group 2110, and finally, high-speed parallel dual-beam lithography is realized on the surface of the lithographic material 2111. The lithographic material is subjected to displacement stepping control under the control of the precision displacement platform 2112.

In an embodiment of the present invention, as shown in FIG. 3B, the light generating system 300 further includes a third-type light conversion assembly 307; the first light forms a mixed first area through the third-type light conversion assembly 307; the mixed first area includes the discrete first area and the continuous first area; the first area is an area which is irradiated by the first light to form a bright area, the continuous first area is an area formed by continuous bright areas, and the discrete first area is an area formed by two or more discontinuous bright areas; the mixed first area is an area formed by the simultaneous presence of continuous bright areas and two or more discontinuous bright areas. With reference to FIG. 2C-1, the first light is grating arrayed light that can form the mixed first area (bright area) and a plurality of dark areas such as the second area (dark area 1), the third area (dark area 2), the fourth area (dark area 3), the fifth area (dark area 4), the sixth area (dark area 5), the seventh area (dark area 6), the eighth area (dark area 7), the ninth area (dark area 8) and the tenth area (dark area 9). Wherein the mixed first area is a combination of the discrete first area and the continuous first area arranged in any manner.

With reference to FIG. 2C-2, the third-type light conversion assembly includes: a fourth lens group 221, a polarizing device 222, a fifth lens group 223, a Gaussian-beam shaping device 224, an annular-beam shaping device 225, a spectroscope 226, a phase-type diffraction grating array 227, a spatial light modulator 228, a lens group 229, a lens group 2210, a lithographic material 2211 and a precision displacement device 2212; and the first light includes the annular light initial input beam hv1 and the solid Gaussian light initial input beam hv2. Beam hv1 first passes through the fourth lens group 221 and then enters the polarizing device 222 to produce a desired polarized beam. The solid Gaussian beam hv2 passes through the fifth lens group 223 and is converted into a flat-top beam by the Gaussian beam shaping device 224. The polarized light beam converted from hv1 is also converted into a hollow flat-top beam by the annular-beam shaping device 225. The shaped two beams are combined through the spectroscope 226 and pass through the phase-type diffraction grating array 227, and the polarized hv1 is converted into array-type vortex light to form annular arrayed light. The annular arrayed light enters a spatial light modulator 228 corresponding to the pixel unit, and the spatial light modulator 228 can control ON and OFF of the double beams of each pixel at a high speed employing a computer program, so that each of the double beams can be modulated and the writing of patterns can be controlled. The dual-beam array coming out of the spatial light modulator 228 is focused through a lens group 229, then the image is miniaturized through an image-miniaturizing lens group 2210, and finally, high-speed parallel dual-beam lithography is realized on the surface of a lithographic material 2211. The lithographic material is subjected to displacement stepping control under the control of a precision displacement platform 2212.

In an embodiment of the invention, the second area or/and the third area is sized on the scale of nanometers.

In an embodiment of the invention, an area irradiated by the second light in the second area is a first super-resolution area; the first super-resolution area has an inner diameter ranging from 0 to 100 nm. In other words, an area where the second area overlaps with the area irradiated by the second light is the first super-resolution area. Since the second area itself is of nano-scale, the smaller the area where the second area overlaps with the area irradiated by the second light is, the smaller the first super-resolution area can be and may approach infinitesimal. Therefore, the inner diameter of the first super-resolution area may preferably range from 0 to 10 nm, even preferably from 0 to 2.4 nm or even smaller.

In an embodiment of the invention, an area irradiated by the third light in the third area is a second super-resolution area; the second super-resolution area has an inner diameter ranging from 0 to 100 nm. In other words, an area where the third area overlaps with the area irradiated by the third light is the second super-resolution area. Since the third area itself is of nano-scale, the smaller the area where the third area overlaps with the area irradiated by the third light is, the smaller the second super-resolution area can be and may approach infinitesimal. Therefore, the inner diameter of the second super-resolution area may preferably range from 0 to 10 nm, even preferably from 0 to 2.4 nm.

Figure 3C:
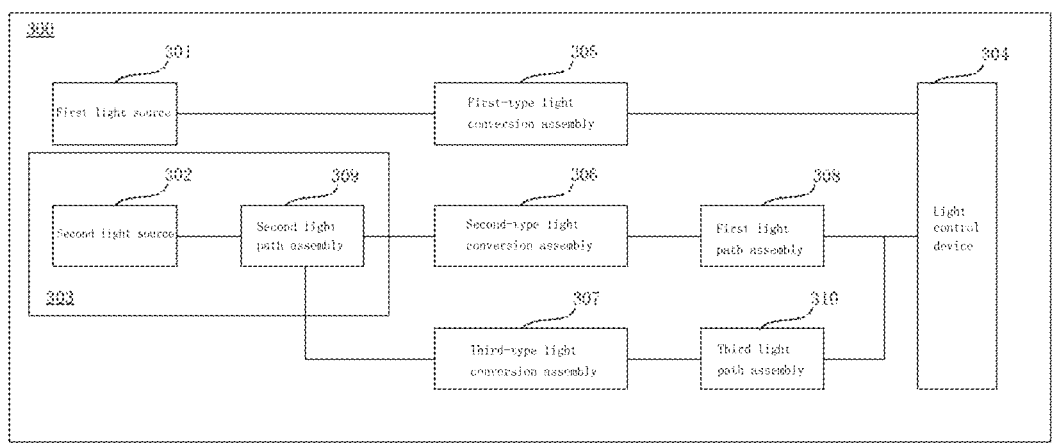
FIG. 3C shows a schematic diagram of a third implementing configuration of the light generating system according to an embodiment of the present invention.

In an embodiment of the present invention, as shown in FIG. 3C, the light generating system 300 further includes first light path assembly 308; the second light simultaneously irradiates the first area and the second area through the first light path assembly 308; the first light path assembly includes any of or a combination of more of optical devices such as a lens group, a shaping device, a polarizing device, a grating, and a spectroscope.

In an embodiment of the present invention, with reference to FIG. 3C, the third light source 303 includes the second light source 302 and second light path assembly 309; the second light path assembly 309 takes a separated part of the second light output by the second light source 302 as the third light; the second light path assembly includes any of or a combination of more of optical devices such as a lens group, a shaping device, a polarizing device, a grating and a spectroscope.

In an embodiment of the present invention, as shown in FIG. 3C, the light generating system 300 further includes third light path assembly 310; the third light simultaneously irradiates the first area and the third area through the third light path assembly 310; the third light path assembly includes any of or a combination of more of optical devices such as a lens group, a shaping device, a polarizing device, a grating, and a spectroscope.

In an embodiment of the present invention, the first light source 301 includes a first Gaussian light source 3011 generating a first Gaussian light.

In an embodiment of the present invention, the first light source 301 includes: the first Gaussian light source 3011 generating the first Gaussian light; and a first flat-top unit 3012 shaping the first Gaussian light into a first flat-top light.

In an embodiment of the present invention, the first light source 301 includes: a first flat-top light source 3013 generating the first flat-top light.

In an embodiment of the present invention, the first light source 301 includes: the first Gaussian light source 3011 generating the first Gaussian light; and a first array unit 3014 shaping the first Gaussian light or the first flat-top light into a first arrayed light.

In an embodiment of the present invention, the first light source 301 includes: the first Gaussian light source 3011 generating the first Gaussian light; a first flat-top unit 3012 shaping the first Gaussian light into the first flat-top light; and a first array unit 3014 shaping the first flat-top light into the first arrayed light.

In an embodiment of the present invention, the first light source 301 includes: a first arrayed light source 3015 generating the first arrayed light.

In an embodiment of the present invention, the second light source 302 includes: a second Gaussian light source 3021 generating a second Gaussian light.

In an embodiment of the present invention, the second light source 302 includes: a second Gaussian light source 3021 generating the second Gaussian light; and a second flat-top unit 3022 shaping the second Gaussian light into a second flat-top light.

In an embodiment of the present invention, the second light source 302 includes: a second flat-top light source 3023 generating the second flat-top light.

In an embodiment of the present invention, the second light source 302 includes: the second Gaussian light source 3021 generating the second Gaussian light; and a second array unit 3024 shaping the second Gaussian light into the second arrayed light.

In an embodiment of the present invention, the second light source 302 includes: the second Gaussian light source 3021 generating the second Gaussian light; the second flat-top unit 3022 shaping the second Gaussian light into the second flat-top light; and the second array unit 3024 shaping the second flat-top light into the second arrayed light.

In an embodiment of the present invention, the second light source 302 includes: a second arrayed light source 3025 generating the second arrayed light.

In an embodiment of the present invention, the third light source 303 includes: a third Gaussian light source 3031 generating a third Gaussian light.

In an embodiment of the present invention, the third light source 303 includes: the third Gaussian light source 3031 generating the third Gaussian light; and a third flat-top unit 3032 shaping the third Gaussian light into a third flat-top light.

In an embodiment of the present invention, the third light source 303 includes: a third flat-top light source 3033 generating the third flat-top light.

In an embodiment of the present invention, the third light source 303 includes: the third Gaussian light source 3031 generating the third Gaussian light; and a third array unit 3034 shaping the third Gaussian light or the third flat-top light into a third arrayed light.

In an embodiment of the present invention, the third light source 303 includes: the third Gaussian light source 3031 generating the third Gaussian light; and the third array unit 3034 shaping the third Gaussian light into the third arrayed light.

In an embodiment of the present invention, the third light source 303 includes: a third Gaussian light source 3031 generating the third Gaussian light; the third flat-top unit 3032 shaping the third Gaussian light into the third flat-top light; and the third array unit 3034 shaping the third flat-top light into the third arrayed light.

In an embodiment of the present invention, the third light source 303 includes: a third arrayed light source 3035 generating the third arrayed light.

In an embodiment of the present invention, the light control device 304 includes: a spatial light modulator 3041, or/and a light power controller 3042; the spatial light modulator 304i controls ON and OFF of the second light or/and the third light to control intensity of the second light or/and the third light.

The light power controller 3042 controls the light radiation power of the second light source to control the intensity of the second light; or/and controlling the light radiation power of the third light source to control the intensity of the third light; or/and controlling the light radiation power of the first light source to control the intensity of the first light.

In summary, the present invention is highly industrially valuable by effectively overcoming various disadvantages of the prior art.

The above-described embodiments merely illustrate the principles and efficacy of the invention and are not intended to limit the invention. Modifications or variations to the embodiments described above will occur to those skilled in the art without departing from the spirit or scope of the invention. Accordingly, it is intended that the appended claims cover all such equivalent modifications and variations made by those of ordinary skill in the art without departing the true spirit and scope of this invention.

The invention claimed is:
1. A light generating method, comprising:
generating a first light, the first light being capable of forming a first area, a second area, and a third area, and intensity of the first light in the first area being higher than that in the second area and the third area, respectively;
generating a second light, the second light being capable of simultaneously irradiating the first area and the second area;
generating a third light, the third light being capable of simultaneously irradiating the first area and the third area, wherein at least one of the following two areas is a super-resolution area:
(1) the area irradiated by the second light in the second area, and
(2) an area irradiated by the third light in the third area; and
controlling intensity of the second light and the third light, respectively.
2. The light generating method according to claim 1, wherein the first light forms a discrete first area through a first light conversion assembly.
3. The light generating method according to claim 2, wherein the first light forms a continuous first area through a second light conversion assembly.
4. The light generating method according to claim 3, wherein the first light forms a mixed first area through a third light conversion assembly; and the mixed first area includes the discrete first area and the continuous first area.

5. The light generating method according to claim 4, further comprising:
controlling intensity of the second light or/and the third light by controlling ON and OFF of the second light or/and the third light; or/and
controlling the intensity of the second light by controlling light radiation power of a light source of the second light; or/and controlling the intensity of the third light by controlling the light radiation power of the light source of the third light; or/and controlling the intensity of the first light by controlling the light radiation power of the light source of the first light.

6. A light generating system, comprising:
a first light source generating a first light, the first light being capable of forming a first area, a second area, and a third area, and intensity of the first light in the first area being higher than that in the second area and the third area, respectively;
a second light source generating a second light, the second light being capable of simultaneously irradiating the first area and the second area;
a third light source generating a third light, the third light being capable of simultaneously irradiating the first area and the third area, wherein at least one of the following two areas is a super-resolution area:
(1) the area irradiated by the second light in the second area, and
(2) an area irradiated by the third light in the third area; and
a light control device controlling intensity of the second light and the third light, respectively.

7. The light generation system according to claim 6, further comprising:
a first light conversion assembly through which the first light forms a discrete first area;
the first light conversion assembly comprising a first lens group, a beam shaping device, a microlens array group, or/and a dual-beam phase conversion array group.

8. The light generating system according to claim 7, further comprising:
a second light conversion assembly through which the first light forms a continuous first area;
the second light conversion assembly comprising a second lens group, a polarizing device, a third lens group, a Gaussian-beam shaping device, an annular-beam shaping device, a spectroscope, or/and a phase diffraction grating array.

9. The light generating system according to claim 8, further comprising:
a third light conversion assembly through which the first light forms a mixed first area; the mixed first area comprising the discrete first area and the continuous first area;
the third light conversion assembly comprising a fourth lens group, a polarizing device, a fifth lens group, a Gaussian-beam shaping device, an annular-beam shaping device, a spectroscope, or/and a phase diffraction grating array.

10. The light generating system according to claim 9, wherein the light control device comprises:
a spatial light modulator for controlling ON and OFF of the second light or/and the third light to control intensity of the second light or/and the third light; or/and
a light power controller for controlling light radiation power of the second light source to control the intensity of the second light; or/and controlling the light radiation power of the third light source to control the intensity of the third light; or/and controlling the light radiation power of the first light source to control the intensity of the first light.

11. The light generating system according to claim 8, further comprising:
a second light conversion assembly through which the first light forms a continuous first area;
the second light conversion assembly comprising a second lens group, a polarizing device, a third lens group, a Gaussian-beam shaping device, an annular-beam shaping device, a spectroscope, or/and a phase diffraction grating array.

12. The light generating system according to claim 11, wherein the light control device comprises:
a spatial light modulator for controlling ON and OFF of the second light or/and the third light to control intensity of the second light or/and the third light; or/and
a light power controller for controlling light radiation power of the second light source to control the intensity of the second light; or/and controlling the light radiation power of the third light source to control the intensity of the third light; or/and controlling the light radiation power of the first light source to control the intensity of the first light.

13. The light generating system according to claim 9, further comprising:
a third light conversion assembly through which the first light forms a mixed first area; the mixed first area comprising the discrete first area and the continuous first area;
the third light conversion assembly comprising a fourth lens group, a polarizing device, a fifth lens group, a Gaussian-beam shaping device, an annular-beam shaping device, a spectroscope, or/and a phase diffraction grating array.

14. The light generating system according to claim 13, wherein the light control device comprises:
a spatial light modulator for controlling ON and OFF of the second light or/and the third light to control intensity of the second light or/and the third light; or/and
a light power controller for controlling light radiation power of the second light source to control the intensity of the second light; or/and controlling the light radiation power of the third light source to control the intensity of the third light; or/and controlling the light radiation power of the first light source to control the intensity of the first light.

15. The light generating method according to claim 1, wherein the first light forms a continuous first area through a second light conversion assembly.

16. The light generating method according to claim 15, further comprising:
controlling intensity of the second light or/and the third light by controlling ON and OFF of the second light or/and the third light; or/and
controlling the intensity of the second light by controlling light radiation power of a light source of the second light; or/and controlling the intensity of the third light by controlling the light radiation power of the light source of the third light; or/and controlling the intensity of the first light by controlling the light radiation power of the light source of the first light.

17. The light generating method according to claim 1, wherein the first light forms a mixed first area through a third light conversion assembly; and the mixed first area includes the discrete first area and the continuous first area.

18. The light generating method according to claim 17, further comprising:
  controlling intensity of the second light or/and the third light by controlling ON and OFF of the second light or/and the third light; or/and
  controlling the intensity of the second light by controlling light radiation power of a light source of the second light; or/and controlling the intensity of the third light by controlling the light radiation power of the light source of the third light; or/and controlling the intensity of the first light by controlling the light radiation power of the light source of the first light.

19. The light generating method according to claim 2, wherein the first light forms a mixed first area through a third light conversion assembly; and the mixed first area includes the discrete first area and the continuous first area.

20. The light generating method according to claim 19, further comprising:
  controlling intensity of the second light or/and the third light by controlling ON and OFF of the second light or/and the third light; or/and
  controlling the intensity of the second light by controlling light radiation power of a light source of the second light; or/and controlling the intensity of the third light by controlling the light radiation power of the light source of the third light; or/and controlling the intensity of the first light by controlling the light radiation power of the light source of the first light.

\* \* \* \* \*